(12) United States Patent
Otake et al.

(10) Patent No.: US 11,901,192 B2
(45) Date of Patent: Feb. 13, 2024

(54) ETCHING PROCESSING METHOD AND ETCHING PROCESSING APPARATUS

(71) Applicant: Hitachi High-Tech Corporation, Tokyo (JP)

(72) Inventors: Hiroto Otake, Tokyo (JP); Takashi Hattori, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 293 days.

(21) Appl. No.: 17/439,756

(22) PCT Filed: Jun. 30, 2020

(86) PCT No.: PCT/JP2020/025609
§ 371 (c)(1),
(2) Date: Sep. 15, 2021

(87) PCT Pub. No.: WO2022/003803
PCT Pub. Date: Jan. 6, 2022

(65) Prior Publication Data
US 2022/0310403 A1   Sep. 29, 2022

(51) Int. Cl.
*H01L 21/311* (2006.01)
*H01L 21/32* (2006.01)
*H01J 37/32* (2006.01)

(52) U.S. Cl.
CPC .... *H01L 21/31122* (2013.01); *H01J 37/3244* (2013.01); *H01J 37/32724* (2013.01);
(Continued)

(58) Field of Classification Search
None
See application file for complete search history.

(56) References Cited

U.S. PATENT DOCUMENTS 6,065,481 A   5/2000  Fayfield et al.
6,299,724 B1  10/2001 Fayfield et al.
(Continued)

FOREIGN PATENT DOCUMENTS

JP   859056731 A   4/1984
JP   H03272135 A   12/1991
(Continued)

OTHER PUBLICATIONS

Office Action dated Jun. 20, 2022 in Taiwanese Application No. 110123793.
(Continued)

*Primary Examiner* — Shamim Ahmed
(74) *Attorney, Agent, or Firm* — Miles & Stockbridge, P.C.

(57) ABSTRACT

To provide an etching processing method and an etching processing apparatus which allow an aluminum oxide film to be etched with high accuracy and with a high selectivity to each of a silicon oxide film and a silicon nitride film, the etching processing method includes the step of placing, in a processing chamber, a wafer having the aluminum oxide film disposed on an upper surface thereof, maintaining the wafer at a temperature of −20° C. or less, and supplying vapor of hydrogen fluoride from a plurality of through holes in a plate-like member disposed above the upper surface of the wafer with a predetermined gap being provided therebetween only for a predetermined period to etch the aluminum oxide film.

28 Claims, 7 Drawing Sheets

(52) U.S. Cl.
CPC . *H01J 37/32834* (2013.01); *H01J 2237/2001* (2013.01); *H01J 2237/334* (2013.01)

(56) References Cited

U.S. PATENT DOCUMENTS

| | | | |
|---|---|---|---|
| 2006/0115935 | A1 | 6/2006 | Hara |
| 2014/0312436 | A1* | 10/2014 | Lagouge ............. B81C 1/00801 257/415 |
| 2015/0099327 | A1* | 4/2015 | Higashi ................. C09K 13/04 252/79.2 |
| 2017/0229290 | A1 | 8/2017 | Kobayashi et al. |
| 2017/0345665 | A1 | 11/2017 | Faguet et al. |
| 2017/0365478 | A1 | 12/2017 | George et al. |
| 2019/0267249 | A1 | 8/2019 | Clark et al. |
| 2019/0385828 | A1* | 12/2019 | Singhal ............. H01L 21/02274 |
| 2020/0027746 | A1 | 1/2020 | Vervuurt et al. |

FOREIGN PATENT DOCUMENTS

| | | |
|---|---|---|
| JP | H08031932 A | 2/1996 |
| JP | H08236503 A | 9/1996 |
| JP | 2006156867 A | 6/2006 |
| JP | 2017143186 A | 8/2017 |
| JP | 2018500767 A | 1/2018 |
| JP | 2018026566 A | 2/2018 |
| JP | 2019519918 A | 7/2019 |
| KR | 10-2001-0005675 A | 1/2001 |
| KR | 10-2018-0018413 A | 2/2018 |
| KR | 10-2020-010099 | 1/2020 |
| WO | 9843285 A1 | 10/1998 |

OTHER PUBLICATIONS

Search Report dated Jul. 28, 2020 in International Application No. PCT/JP2020/025609.
Written Opinion dated Jul. 28, 2020 in International Application No. PCT/JP2020/025609.
Y. Lee, et al. "Mechanism of Thermal Al2O3 Atomic Layer Etching Using Sequential Reactions with Sn(acac)2 and HF", Chemistry of Materials, 27,(2015), pp. 3648-3657.
Office Action dated Sep. 4, 2023 in Korean Application No. 10-2021-7029368.

* cited by examiner

ETCHING PROCESSING METHOD AND ETCHING PROCESSING APPARATUS

TECHNICAL FIELD

The present invention relates to an etching processing method and an etching processing apparatus which etch away, in steps of manufacturing a semiconductor device, an aluminum oxide film to be processed that is formed in advance on a specimen on a substrate such as a semiconductor wafer.

BACKGROUND ART

In an increasingly miniaturized semiconductor device, to form a complicated structure, in addition to conventionally used thin films such as a silicon film, a silicon oxide film, and a silicon nitride film, another thin film made of a new type material is in demand. Accordingly, in etching a structure in which such thin films are stacked in layers to form a circuit, an etching technique that achieves a high selectivity between a film to be processed and another film of a different type is in strong demand. Examples of these new thin film materials include an aluminum oxide film.

An example of a step of forming a semiconductor device from a film structure using such an aluminum oxide film will be described using FIGS. 6A to 6D. FIGS. 6A to 6D includes cross-sectional views each schematically illustrating an example of a multi-layered film structure including an aluminum oxide film to be subjected to etching processing. Each of the plurality of cross-sectional views in this drawing illustrates the film structure in each of the plurality of steps including a step of etching.

FIG. 6A illustrates an example using the aluminum oxide film as an etching mask for films in lower layers therebelow. First, an aluminum oxide 601 is dry-etched into a predetermined pattern. Then, using the aluminum oxide film 601 etched into a shape of the pattern as the etching mask, etching is performed on a lower-layer film 602 to be etched. Then, as illustrated in the right view in this drawing, the aluminum oxide film 601 that is no longer needed is removed and, in a step therefor, it is required that a high selectivity to the lower-layer film 602 to be etched, an underlying film 603, or the like is achieved.

FIG. 6B illustrates an example using the aluminum oxide film as a spacer. When the aluminum oxide film 601 is formed on a structure having the upper-layer film 604 over the underlying film 603 and then anisotropically etched using a dry etching technique, a "spacer" structure in which the aluminum oxide film 601 is left only on lateral sides of the structure can be formed. After the spacer structure is used as a doping mask, an epitaxial mask, or a pattern mask for processing of the film structure, as illustrated in the right view in this drawing, a step of removing the aluminum oxide film 601 that is no longer needed is performed.

FIG. 6C illustrates an example using the aluminum oxide film as a portion of a device. In a high-performance device such as a logic device, to control work functions of a gate oxide film and a gate electrode, "work function metal" is formed and, as a portion thereof, aluminum oxide may be used. However, there is a case where the work function metal comes in different film thicknesses or different film types for an N-type transistor and a P-type transistor and, in this case, a step of covering one side with a photoresist or the like and removing an unneeded portion is performed.

In the left side view in this drawing, the aluminum oxide film 601 disposed to cover the lower-layer film 602 which is a film to be etched from thereabove forms the work function metal, and a left side portion thereof is covered with a photoresist film 605 disposed thereover. A right side portion of the aluminum oxide film 601 corresponds to the unneeded portion, and an upper surface of this portion is not masked. The right side view in this drawing illustrates a state in which the right side portion of the aluminum oxide 601 is selectively removed.

FIG. 6A illustrates an example in which the aluminum oxide film is used as a capacitor insulating film. To avoid a reduction in capacitor capacitance resulting from miniaturization, a high-dielectric-constant material may be used as a capacitor insulating film and, as a material of this insulating film, aluminum oxide is used. This drawing illustrates a cross section of a structure in which the aluminum oxide film 601 is disposed between the electrode film 605 and the underlying film 603. For processing of the aluminum oxide film 601 in accordance with a shape of the overlying electrode film 605, dry etching is mainly used.

Etching aimed at removal of the aluminum oxide film, which is shown above using the step illustrated in FIGS. 6A to 6D as an example, has conventionally been performed by wet processing performed by dipping a film structure in a chemical solution. As an example of such wet processing using a chemical solution, an example of, e.g., Japanese Unexamined Patent Application Publication No. 2006-156867 (Patent Literature 1) has conventionally been known. The present example discloses selective etching performed by bringing an etchant into contact with a γ-aluminum oxide film and performing hydrofluoric acid treatment or phosphoric acid treatment.

Meanwhile, Japanese Unexamined Patent Application Publication No. Hei 8(1996)-31932 (Patent Literature 2) shows an example of a step of processing of removing an aluminum oxide film using a hot phosphoric aid solution to leave a tungsten film only in a contact hole 14 without removing the tungsten film and a silicon oxide film below the aluminum oxide film. In addition, Japanese Unexamined Patent Application Publication No. Hei 8(1996)-236503 (Patent Literature 3) discloses that a wet etching method for aluminum oxide using an aqueous phosphoric acid solution has conventionally been known.

However, in such wet etching processing, as a result of increased miniaturization of a structure of a semiconductor device, problems of deformation of a circuit structure formed on a wafer surface by etching processing due to surface tension of a chemical solution, pattern collapse which is collapse of a wall between trenches, and etching residues in a trench, a hole, or a gap have become obvious. In addition, a need for a large amount of chemical processing has presented a problem. Consequently, it is requested to replace isotropic etching using wet processing using a chemical solution with isotropic etching performed by dry processing without using a chemical solution.

Meanwhile, as an example of processing of dry-etching such an aluminum oxide film, Japanese Unexamined Patent Application Publication No. Hei 8(1996)-236503 (Patent Literature 3) discloses a technique of etching an aluminum oxide film by using a plasma formed using a gas containing a saturated or unsaturated hydrogen carbide gas containing a boron trichloride gas and fluorine as well as a CO gas or a $CO_2$ gas, or a gas containing a boron trichloride gas and at least one gas selected from a group consisting of lower alcohol and saturated or unsaturated hydrogen carbide having a carbon number of 1 to 5. In addition, Japanese Unexamined Patent Application Publication No. Sho 59(1984)-56731 (Patent Literature 4) discloses an example in which an aluminum oxide film is etched using a plasma formed using an etching gas such as $CCl_4$, $BCl_3$, $Cl_2$, or $SiCl_4$.

However, in the related art technique described above, anisotropic etching is performed using ion assist which induces charged particles such as ions in the plasma to the aluminum oxide film which is a film to be etched and causes the charged particles to collide with the aluminum oxide film to accelerate etching. Accordingly, it has been difficult to use the related art technique for a removal step which requires isotropic etching.

Meanwhile, as an example of a technique of removing aluminum oxide using only a gas, a technique disclosed in Japanese Unexamined Patent Application Publication No. Hei 3(1991)-272135 (Patent Literature 5) has been known. This related art technique discloses a technique of removing an aluminum oxide film by setting a temperature in a chamber to 200° C., setting a pressure in the chamber to 9 Torr, and causing the aluminum oxide film to react with a ClF3 gas.

Meanwhile, in Y. Lee, J. W. Dumont and S. M. George, "Mechanism of Thermal Al2O3 Atomic Layer Etching Using Sequential Reactions with Sn(acac)2 and HF", Chemistry of Materials, 27, 3648 (2015) (Nonpatent Literature 1), a method of etching aluminum oxide through repeated application of tin complex and hydrogen fluoride is proposed. However, a vapor pressure of the tin complex is low and is not effective for real etching. In addition, since a high temperature of 200° C. or more is required, it is difficult to avoid the problems of diffusion and corrosion mentioned above.

CITATION LIST

Patent Literatures

Patent Literature 1: Japanese Unexamined Patent Application Publication No. 2006-156867
Patent Literature 2: Japanese Unexamined Patent Application Publication No. Hei 8(1996)-31932
Patent Literature 3: Japanese Unexamined Patent Application Publication No. Hei 8(1996)-236503
Patent Literature 4: Japanese Unexamined Patent Application Publication No. Sho 59(1984)-56731
Patent Literature 5: Japanese Unexamined Patent Application Publication No. Hei 3(1991)-272135 Nonpatent Literature
Nonpatent Literature 1: Y. Lee, J. W. Dumont and S. M. George, "Mechanism of Thermal Al2O3 Atomic Layer Etching Using Sequential Reactions with Sn(acac)2 and HF", Chemistry of Materials, 27, 3648 (2015)

SUMMARY OF INVENTION

Technical Problem

The related-art techniques described above have given only insufficient consideration to points described below, and therefore problems have occurred.

Specifically, as semiconductor devices increasingly miniaturized, a 3D logic device such as FinFET or Gate-All-Around, a 3D-DRAM serving as a memory device, a 3D-NAND process, and the like have been progressively studied. However, to perform nanometer-level high-accuracy processing of such complicated structures, three existing thin films of a silicon film, a silicon oxide film, and a silicon nitride film are insufficient to produce devices, and microfabrication of aluminum oxide and a step of peeling aluminum oxide are necessary. At this time, a technique of peeling only aluminum oxide and leaving the silicon film, the silicon oxide film, and the silicon nitride film substantially unetched is in strong demand.

However, as a technique of peeling an aluminum oxide film according to the related-art technique, etching based on wet processing using an aqueous hydrofluoric acid solution or an aqueous phosphoric acid solution causes etching residues in a structure having trenches spaced apart at extremely small distances or a hole having an extremely small diameter, pattern collapse, or the like, and has a problem in that a circuit structure cannot accurately be formed and a processing yield is reduced. In addition, since the related-art technique described above performs the anisotropic etching using the ion assist which induces charged particles such as ions in a plasma resulting from boron trichloride or the like to the aluminum oxide film corresponding to the film to be etched and causes the charged particles to collide with the aluminum oxide film to accelerate etching, the related-art technique described above has a problem in that it is difficult to perform isotropic etching.

Moreover, the technique disclosed in Patent Literature 5 is required to maintain a high temperature of 200° C. in the chamber, and chlorine atoms may be diffused not only in aluminum oxide, but also in another material adjacent thereto to cause corrosion or degradation of device characteristics. Thus, in the related-art techniques, sufficient consideration has not been given to the problem that the aluminum oxide film cannot isotropically be removed and, in processing, processing accuracy and a processing yield are reduced.

The present invention has been achieved in view of the problems described above, and an object of the present invention is to provide an etching processing method and an etching processing apparatus which allow an aluminum oxide film to be etched with high accuracy and with a high selectivity to each of a silicon oxide film and a silicon nitride film.

Solution to Problem

The object described above is attained by an etching processing method including the step of: placing, in a processing chamber, a wafer having an aluminum oxide film disposed on an upper surface thereof, maintaining the wafer at a temperature of −20° C. or less, and supplying vapor of hydrogen fluoride from a plurality of through holes in a plate-like member disposed above the upper surface of the wafer with a predetermined gap being provided therebetween only for a predetermined period to etch the aluminum oxide film.

The object described above is also attained by an etching processing apparatus including: a vacuum container; a stage disposed in a space of the vacuum container and having an upper surface on which a wafer to be processed having an aluminum oxide film disposed in advance on a surface thereof is to be placed; a plate member disposed above the aluminum oxide film of the wafer being placed on the stage to face the aluminum oxide film with a predetermined gap being provided therebetween, the plate member including a plurality of through holes through which vapor of a processing gas containing hydrogen fluoride is to be introduced into a space located above the aluminum oxide film and including an interior of the gap; and a temperature adjustment mechanism that adjusts a temperature of the stage or the wafer placed thereon to −20° C. or less.

Advantageous Effects of Invention

It is possible to provide an etching processing method or an etching processing apparatus which allows an aluminum oxide film to be etched at an etching speed higher than those at which a silicon oxide film and a silicon nitride film are etched and allows the aluminum oxide film to be etched with high accuracy and with a high selectivity to each of the silicon oxide film and the silicon nitride film.

DESCRIPTION OF EMBODIMENTS

Embodiments of the present invention will be described below using drawings.

Each of the embodiments of the present invention is based on the finding that, in a corrosion test in which hydrogen fluoride and a methanol gas were introduced into a chamber, when a silicon wafer was placed with an aluminum oxide material facing downward, an end portion of the material was etched.

Specifically, to evaluate etching processing of a silicon oxide film using hydrogen fluoride and a methanol gas, the present inventors evaluated resistance to corrosion of an aluminum oxide film having a possibility of being used as a material forming a processing chamber. As samples to be evaluated, a group of three members respectively having a silicon nitride film, a silicon oxide film, and an aluminum oxide film formed as coatings on planar surfaces each having an area smaller than that of an upper surface of a sample wafer were placed on an upper surface of the silicon wafer with the individual films facing upward and fixed with Kapton tape. In addition, another group of samples were placed on the upper surface of the silicon wafer with films displaced on respective surfaces of members facing downward (to face the upper surface of the silicon wafer) and similarly fixed.

Into a processing chamber, the silicon wafer having these six etching samples placed thereon was introduced and placed on a stage in the processing chamber. Then, into the sealed processing chamber, hydrogen fluoride, methanol, and an argon gas were introduced in respective amounts of 400 sccm, 200 sccm, and 100 sccm, and a pressure in the processing chamber was adjusted using a butterfly valve to be maintained at 300 Pa. In the chamber, the silicon wafer was held on the stage only for 120 seconds, while being maintained at a temperature of −35° C.

Figure 7:
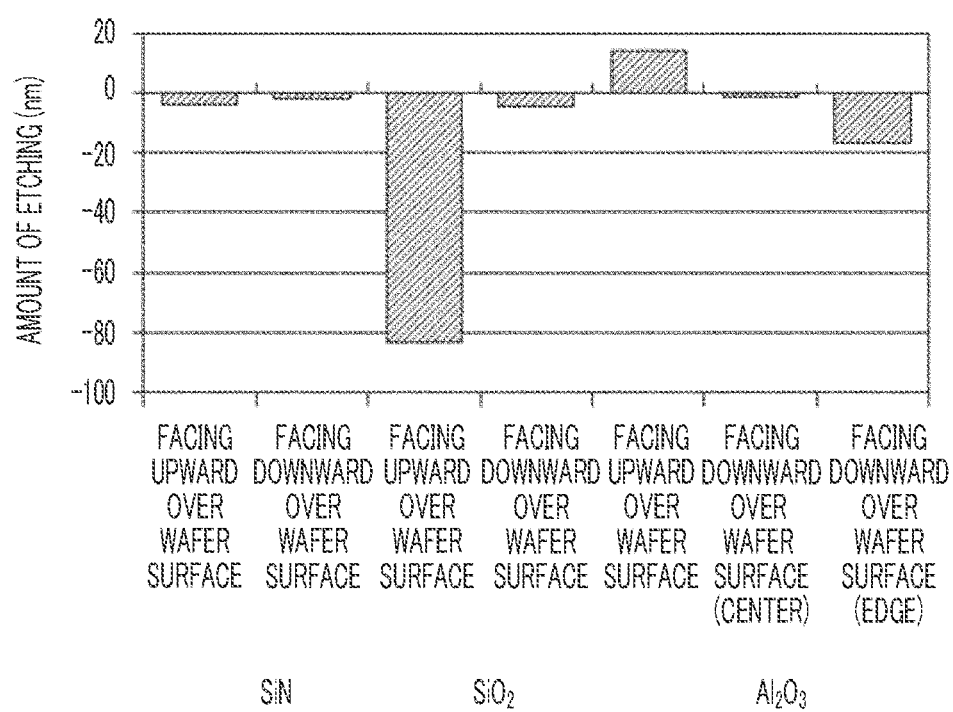
FIG. 7 is a graph illustrating amounts of etching of coatings of a plurality of types on sample surfaces.

FIG. 7 illustrates a result of detecting amounts of etching of the coatings on the surfaces of the samples. FIG. 7 is a graph illustrating the amounts of etching of the coatings of the plurality of types on the surfaces of the samples.

The amounts of etching of the silicon nitride films on the samples which were placed on the sample wafer with the coatings facing upward and downward were about 5 nm or less. Meanwhile, the silicon oxide film placed on the sample wafer with the surface of the coating facing upward was etched over 80 nm or more, while the amount of etching of the silicon oxide film placed on the sample wafer with the surface of the coating facing downward was 5 nm or less.

The aluminum oxide film placed on the sample wafer with the coating facing upward had an increased film thickness due to a deposit formed on the wafer. Meanwhile, for the aluminum oxide film placed on the sample wafer to face downward, substantially no amount of etching was obtained at a center portion of the coating on a downwardly facing surface portion of the sample placed on and facing the sample wafer, while an amount of etching slightly less than 20 nm was obtained on a peripheral edge portion of the coating. Etching of the peripheral edge (edge) portion was observed in a region from an outer peripheral edge of the downwardly facing planar surface of the etching sample after being cut to a point at a distance of 2 mm or less therefrom in a direction toward the center of the downwardly facing surface. In addition, it was found that, under the same conditions, a selectivity of about 4 to each of the silicon oxide film and the silicon nitride film was ensured.

As a result of study conducted by the present inventors, it was found that the etching of the aluminum oxide film mentioned above was achieved at the peripheral edge portion of the film in a state where, under conditions under which a HF+CH3OH gas was supplied at a temperature of −35° C., the sample was placed on the upper surface of the sample wafer and the planar surface thereof was held to face the upper surface of the sample wafer, particularly with a narrow gap being held therebetween. Such a phenomenon was conceivably attributable to partial condensation of hydrogen fluoride on each of the upper surface of the low-temperature sample wafer and the surface of the sample covered with the aluminum oxide coating facing each other with the narrow gap being held therebetween. It is considered that a liquid or molecules of the condensed hydrogen fluoride entered the narrow gap between the silicon aluminum film and the silicon wafer from an outer peripheral end edge of the surface of the sample in accordance with a principle of movement in capillary action to etch the aluminum oxide film falling within a range of 2 mm from the outer peripheral end edge which was reached by the liquid of hydrogen fluoride.

Based on a result of the study, a distance between the wafer having the aluminum oxide film which is disposed on a surface thereof and can be etched and a plane facing the wafer is to be examined. The following is a known expression representing a range in which capillary action occurs.

$$h = 2T \cos \theta / \rho g r$$

where h represents a penetration height, T represents a surface tension, cos θ represents a contact angle, ρ represents a density, g represents a gravity acceleration, and r represents an inner diameter of a pipe. Physical properties of the liquid of hydrogen fluoride are described in detail in Shunsuke MURAHASHI, Shumpei SAKAKIBARA, "Anhydrous Hydrogen Fluoride as Solvent", Journal of Synthetic Organic Chemistry, Volume 25, Issue 12, Pages 1176-1191 (1967). According to the above, the surface tension is 0.012 N/m (−23° C.) and lower than that of water, and the density of the liquid of hydrogen fluoride is 1002 kg/m3 and substantially equal to that of water. Since 2 mm actually measured as h and the contact angle are unknown, when the same values as those of water are used, r corresponding to the pipe inner diameter r is 1.15 mm. Accordingly, the distance between the wafer and the facing surface is preferably 1 mm or less.

As described above, as conditions for processing of etching an aluminum oxide film with high accuracy and with a high selectivity to each of a silicon oxide film and a silicon nitride film, a supply of hydrogen fluoride and methanol as an etching gas to a film structure having an aluminum oxide film on a surface of a plane forming a gap of 1 mm or less maintained at a value within a temperature range of −20° C. to −50° C., and preferably at −35° C. is obtained as knowledge.

Figure 1:
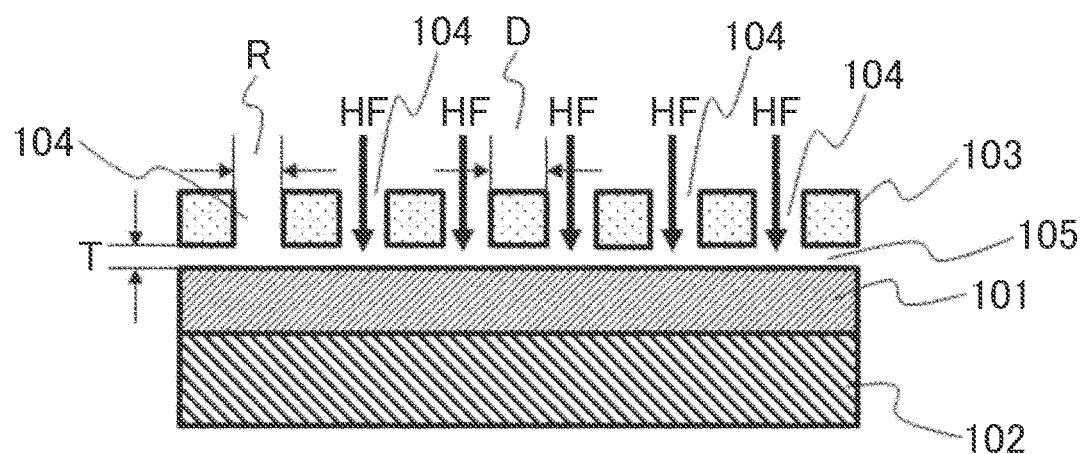
FIG. 1 is a vertical cross-sectional view schematically illustrating an outline of a configuration of a main portion including a wafer placed in a processing chamber in an etching processing apparatus according to an embodiment of the present invention.

Using FIG. 1, a characteristic configuration in an embodiment of the present invention will be described. FIG. 1 is a vertical cross-sectional view schematically illustrating an outline of a configuration of a main portion including a wafer placed in a processing chamber in an etching processing apparatus according to the embodiment of the present invention.

In this drawing, a vertical cross section of the vicinity of an upper surface of a wafer being placed on a stage not shown in a processing chamber is schematically illustrated. In this drawing, on the upper surface of the wafer, an aluminum oxide film 101 is disposed on an upper surface of a substrate 102 of the wafer, and a gas shower plate 103 having a plurality of through holes 104 is further disposed above a surface thereof with a gap 105 being provided therebetween.

In addition, the top surface of the aluminum oxide film 101 and a lower surface of the gas shower plate 103 are disposed to face each other, while a distance between the lower surface of the gas shower plate 103 and an upper surface of the aluminum oxide 101 or the substrate 102 is held at a value approximate to a predetermined value at which the lower surface and the upper surface are parallel with each other or can be regarded as being parallel with each other over entire regions of these surfaces except for opening portions in lower ends of the through holes 104. Particularly in the present embodiment, a size (distance) T of the gap 105 between the lower surface of the gas shower plate 103 and the aluminum oxide 101 corresponding to the distance mentioned above is held at 1 mm or less.

The gas shower plate 103 includes the plurality of through holes 104 and, through the through holes 104, a processing gas such as hydrogen fluoride for etching the aluminum oxide film 103 is supplied. In the present embodiment, the interval T of the gap between the gas shower plate 103 and the upper surface of the substrate 102 or the aluminum oxide film 101 is set to a value of 3 mm or less, and preferably to 1 mm or less.

A distance between the openings in the lower ends of the adjacent two through holes 104 in the gas shower plate 103, a length of the lower surface of the gas shower plate 103 therebetween, or a distance D between the lower end opening of each of the through holes 104 and an outer peripheral end edge of the gas shower plate 103 is set to a value of at least 1 mm and at most 3 mm, and preferably 2 mm. In addition, a diameter of each of the through holes 104 is set to a value in a range of at least 1 mm and at most 3 mm, and preferably to 2 mm. As a material forming the gas shower plate 103, quartz is used, but is not limited thereto, and a material which exhibits a relatively small reaction with vapor of hydrogen fluoride and less progressive wear, such as another ceramic material or a resin material, can be used.

In the present embodiment, a pressure in the gap between the gas shower plate 103 and the substrate 102 or the aluminum oxide film 101 is maintained at several hundreds of Pascals, and preferably at 300 Pa and, to achieve this, a supply of the processing gas and a flow rate or speed of an exhaust gas are adjusted. The processing gas to be supplied is not limited only to hydrogen fluoride and may also contain alcohol such as methanol, a rare gas, or another gas.

The aluminum oxide film 101 and the substrate 102 are placed and held on a support mechanism such as a wafer stage in which a flow path for a refrigerant connected to a device that adjusts a temperature of the refrigerant such as a chiller is disposed, though not shown. Through adjustment of the support mechanism by an internal temperature adjustment mechanism to a temperature in a predetermined range, a temperature of the substrate 102 having the aluminum oxide film 101 disposed on the top surface thereof is maintained at a value in a range of at most −20° C. and at least −50° C., and preferably at −35° C. appropriate for etching processing of the aluminum oxide film 101, which occurs as a result of a supply of the processing gas from the gas shower plate 103 and a reaction of hydrogen fluoride vapor condensed or changed into liquid droplets in the gap 105.

First Example

Figure 2:
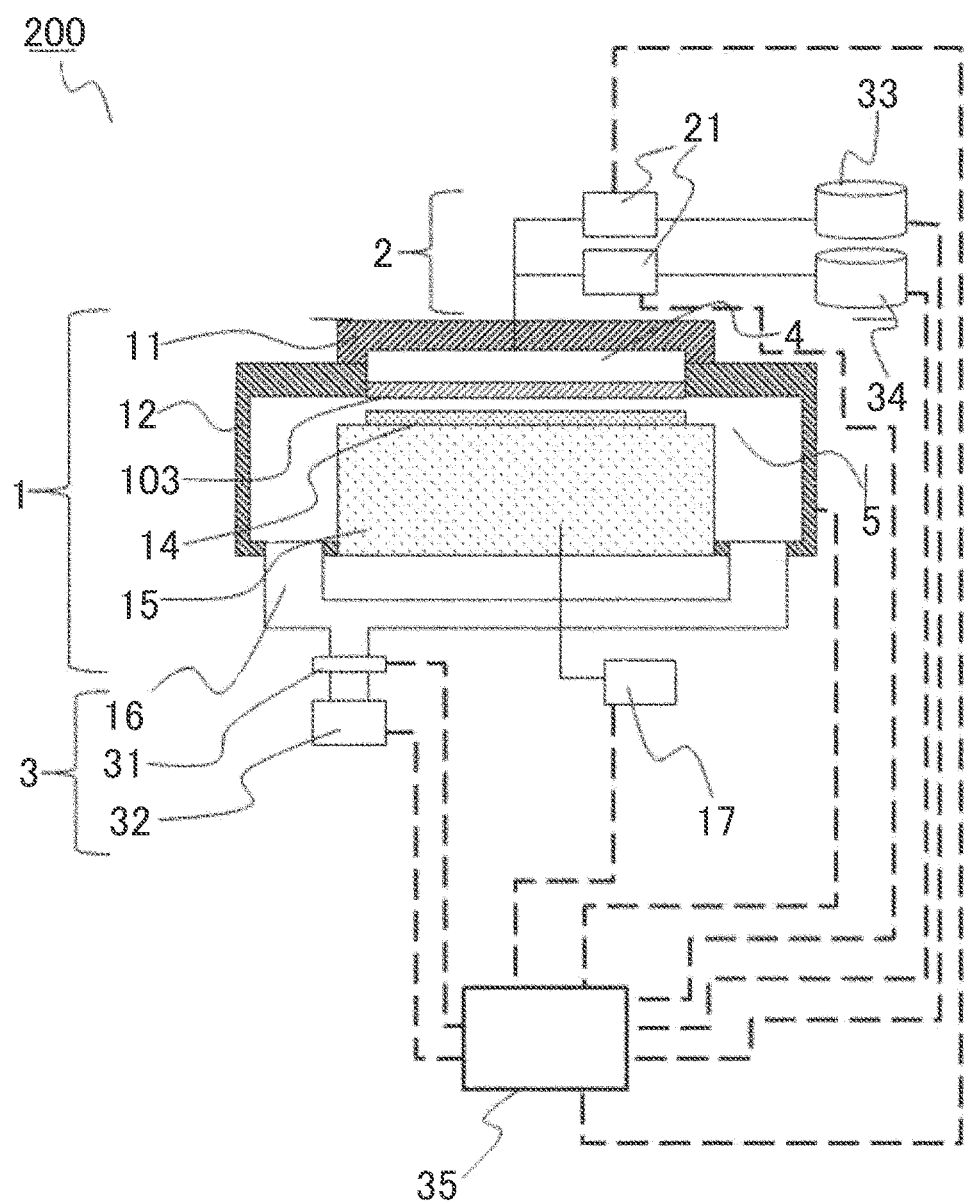
FIG. 2 is a vertical cross-sectional view schematically illustrating an outline of a configuration of an etching processing apparatus according to the present example.

An example of the present invention will be described below in detail based on FIG. 2. FIG. 2 is a vertical cross-sectional view schematically illustrating an outline of a configuration of an etching processing apparatus according to the present example.

In this drawing, an etching processing apparatus 200 includes, roughly speaking, a vacuum chamber 1 including a processing chamber 5 which is a space having a cylindrical shape to be internally evacuated, a gas line 2 connected to the vacuum chamber 1 and including pipes and a valve each intended to introduce a gas into the processing chamber 5, and an exhaust unit 3 including a vacuum pump connected to a bottom surface of the vacuum chamber 1 to communicate with the processing chamber 5 and exhaust particles of a gas, a compound, or the like in the processing chamber 5 to the outside of the processing chamber 5. The vacuum chamber 1 includes a top chamber 11 which is a cylindrical vacuum container made of metal and having a center axis in a vertical direction and a base chamber 12 connected to the top chamber 11 therebelow. In the base chamber 12, the processing chamber 5 which is the cylindrical space is disposed and, at a center portion of a lower part of the processing chamber 5, a stage 15 having a cylindrical shape and having an upper surface on which a wafer 14 to be processed is to be placed is disposed. The stage 15 includes an inner flow path not shown in which a cooling medium circulates to be supplied to be able to cool the wafer 14 having a circular disk shape and placed on the stage 15 to a low temperature of −20° C. or less. The wafer 14 has a coating made of a dielectric material and forming an upper surface having the same circular shape as that of the wafer 14.

An upper part of the base chamber 12 is formed of a ring-shaped member covering the processing chamber 5 and, on a center portion thereof, the top chamber 11 is placed to be connected to the base chamber 12. The top chamber 11 having the cylindrical shape in the present example includes a buffer chamber 4 which is a space connected to the gas line 2 to communicate therewith and supplied with the processing gas. The gas supplied into the buffer chamber 4 is diffused therein.

Between the buffer chamber 4 in the top chamber 11 and the processing chamber 5 in the base chamber 12, the gas shower plate 103 which is a member having a circular disk shape and made of a dielectric material such quartz is disposed. By the gas shower plate 103, the upper and lower two chambers are defined to communicate with each other through the plurality of through holes disposed in the shower plate 13. The gas shower plate 103 in the present example is a member in the form of a circular disk inserted into a communication path between the processing chamber 5 including a circular through hole in a center portion of the ring-shaped plate member made of metal and forming the lid portion of the base chamber 12 and the buffer chamber 4. The gas shower plate 103 is disposed such that a lower surface thereof faces, at a lower end portion of the communication path, the upper surface of the stage 15 therebelow to form a ceiling surface of the processing chamber 5.

At a bottom portion of the base chamber 12, an exhaust port included in the exhaust unit 3 to provide communication between the processing chamber 5 and the outside is disposed. Through the exhaust port 16, the gas and particles of a product in the processing chamber 5 are exhausted to the outside by an operation of the vacuum pump of the exhaust unit 3.

Note that the stage 15 in the present example is connected by the pipes to a chiller 17 that adjusts a temperature of the cooling medium (refrigerant) flowing in the flow path therein to a value in a predetermined range. The refrigerant circulates between the chiller 17 that adjusts the temperature and the flow path in the stage 15 in response to an operation of the pump not shown to maintain the temperature of the stage 15 and consequently the temperature of the wafer 14 held on the upper surface thereof to −20° C. or less. For such adjustment of the temperature of the wafer 14, not only the circulation of the refrigerant having the adjusted temperature, but also any of conventionally known temperature adjustment means such as an electrostatic chuck or mechanical chuck that holds the wafer 14 onto the upper surface of the stage 15 in contact relation, acceleration of heat transfer by a conductive gas supplied therebetween, temperature adjustment using a heating or cooling element embedded in the stage 15 such as a Peltier element, and heating using radiation from a lamp disposed above the stage 15 or a combination thereof may also be used.

The illustrated pipes of the gas line 2 are connected to the upper surface of the top chamber 11, and the processing gas flowing therein is introduced into the buffer chamber 4 from the upper part thereof. The gas line 2 in the present example is connected to reservoir units 33 and 34 serving as gas sources of gases required for the etching processing of the aluminum oxide film, such as the hydrogen fluoride gas and alcohol ($C_xH_yOH$) such as methyl alcohol or ethyl alcohol each serving as the processing gas. Each of the gases from the gas reservoir units 33 and 34 flowing in each of the pipes has a flow rate or a speed thereof adjusted to a value in a range appropriate for the processing by a mass flow unit 21 including a valve that opens/closes flow paths disposed in the pipes respectively connected to the gas reservoir units 33 and 34 to form the gas line 2 or increases/reduces cross-sectional areas thereof and a pressure meter.

In the present example, the plurality of pipes disposed individually for the plurality of types are connected between the respective connection portions of the mass flow unit 21 and the top chamber 11 to form a single pipe in which a gas mixture resulting from joining together and mixing of the plurality of types of gases flows and which is connected to the top chamber 11. Such mixing of the gases is not limited to a place closer to the mass flow unit 21 than the connection portion with the top chamber 11. It may also be possible that the plurality of pipes in which the individual gases forming the processing gas mixture flow are connected to the top chamber 11, and the gases are diffused in the buffer chamber 4 to be mixed with each other to have a composition having partial pressures or a molar ratio appropriate for the processing. The types of the individual gases used for the processing gas mixture in the present example to be described below are not limited to hydrogen fluoride vapor and alcohol such as methanol vapor. Any gas may be used as long as the gas is required for the etching of the aluminum oxide film, such as argon, nitrogen, helium, or another gas.

The exhaust unit 3 includes a mechanical booster pump 32 including the exhaust port 16 and driven to exhaust particles in the processing chamber 5 therefrom and internally evacuate the processing chamber 5 and the butterfly valve 31 disposed over an exhaust duct providing connection therebetween to increase/reduce a cross-sectional area of the flow path for an exhaust gas therein and adjust a flow rate or speed of the exhaust gas. The butterfly valve 31 includes a plurality of flaps each having a plate shape to rotate around an axis disposed in a direction traversing the exhaust duct. Angles of rotation of these flaps around the axis are increased/reduced to increase/reduce the flow rate or speed of the exhaust gas. The pressures in the processing chamber 5 and the buffer chamber 4 are adjusted by a balance between an amount of the processing gas supplied from the gas line 2 or a speed thereof and an amount of the exhaust gas from the processing chamber 5 that is exhausted from the exhaust unit 3 or a speed thereof.

A means for adjusting the amount of the exhaust gas for adjustment of the pressure in the processing chamber 5 or the buffer chamber 4 is not limited to the butterfly valve 31, and another means may also be used. A means for exhausting the gas from the processing chamber 5 is also not limited to the mechanical booster pump 32, and a rotary pump, a dry pump, a turbo molecular pump, or a combination thereof may also be used.

Figure 5:
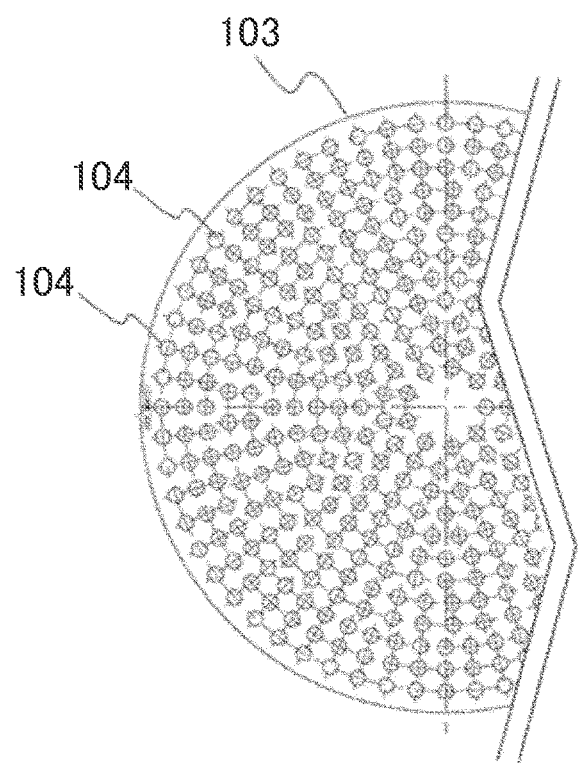
FIG. 5 is a top view illustrating a configuration of a gas shower plate of the etching processing apparatus according to the example illustrated in FIG. 2.
Figure 6A:
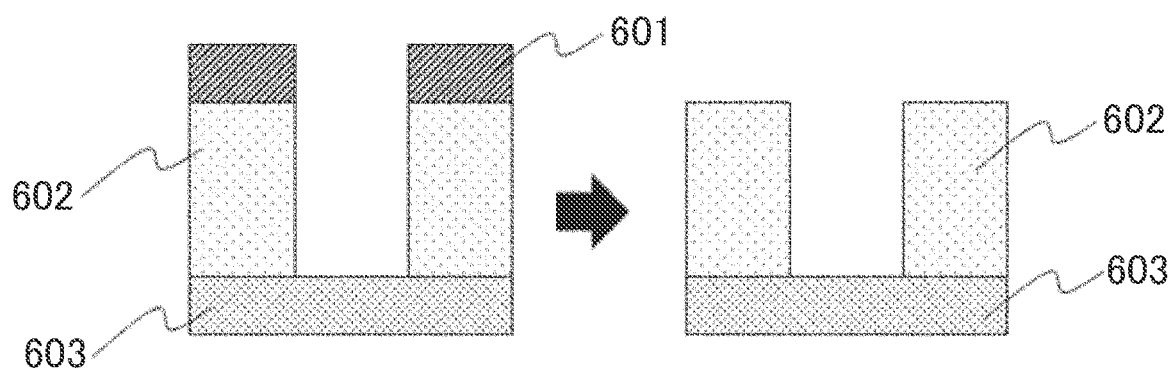
FIGS. 6A to 6D are cross-sectional views schematically illustrating an example of a multi-layered film structure including an aluminum oxide film to be subjected to etching processing.
Figure 6B:
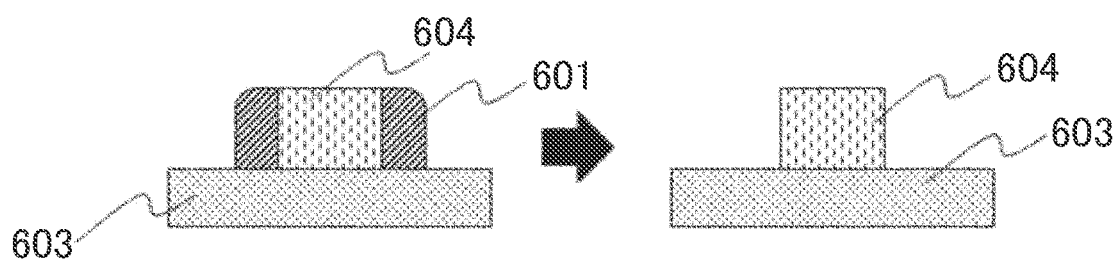
Figure 6C:
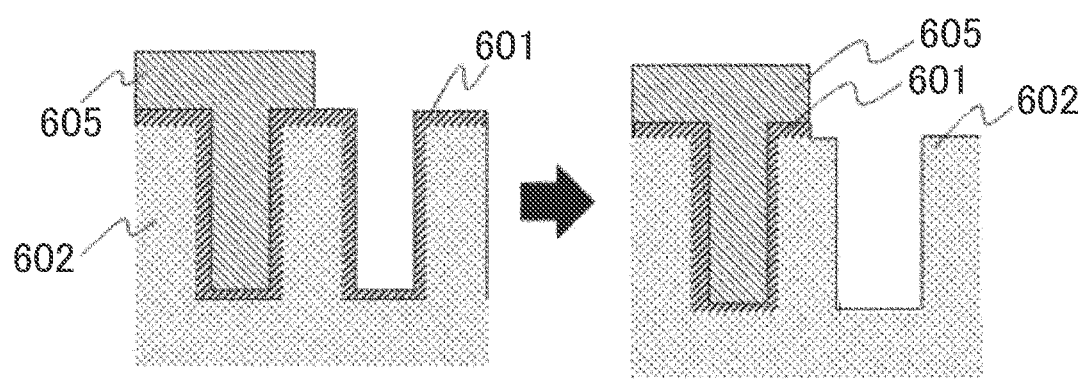
Figure 6D:
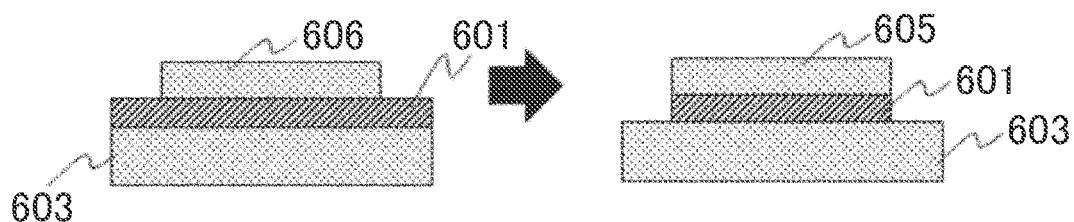

An example of a shape of the gas shower plate 103 disposed between the top chamber 11 and the base chamber 12 and disposed in the communication path which provides communication between the buffer chamber 4 and the processing chamber 5 that are respectively disposed in the individual chambers will be described using FIG. 5. FIG. 5 is a top view illustrating a configuration of the gas shower plate of the etching processing apparatus according to the example illustrated in FIG. 2, which is a view illustrating the shape of the circular gas shower plate 103 when viewed in a downward direction from a position above the vertical center axis thereof.

Note that the gas shower plate 103 in this drawing is a circular plate member made of quartz, having a uniform thickness or a thickness that can be regarded as being approximately uniform, and having the plurality of through holes 104. The gas shower plate 103 has the shape symmetrical about the center axis in terms of the circular disk shape and also of positions at which the through holes 104 are disposed and has a structure symmetrical in a horizontal direction (in-plane direction) which is laterally symmetrical along an axis extending through the axis in a horizontal direction (top-down direction in the drawing). Accordingly, illustration of a right side region in the drawing is omitted.

Each of the plurality of through holes 104 in the gas shower plate 103 is disposed such that the opening in an upper surface or the lower surface thereof is spaced apart from that of the adjacent through hole 104 at an interval (distance) of 1 mm to 3 mm. Each of the through holes 104 has a cylindrical shape having a uniform diameter in the vertical direction, and the diameter has a value in a range of 1 mm to 3 mm. In the present example, based on a result of experiment conducted by the present inventors, the through holes 104 are disposed to be spaced apart from each other at intervals of 2 mm which allow a preferred result to be obtained in the etching of the aluminum oxide film and have structures each having a diameter of 2 mm. Note that the structure of each of the through holes 104 is not limited to the cylindrical shape having the uniform diameter.

In addition, in the example illustrated in FIG. 5, the plurality of through holes 104 are disposed at positions at predetermined intervals on line segments/axes in a radial direction from a center to an outer peripheral end edge except on the center axis and on the outer peripheral end portion. The plurality of through holes 104 on such line segments/axes are radially arranged at each predetermined angle around the vertical center axis. The arrangement of the through holes 104 is not limited to such a radial arrangement, and the through holes 104 may also be arranged such that center axes of the through holes 104 are located at positions in the drawing at which a plurality of lateral axes and a plurality of vertical axes perpendicularly crossing each other cross each other, i.e., in a so-called grid configuration.

A thickness of the plate of the gas shower plate 103 is set to allow the gas shower plate 103 to have a material strength which prevents the gas shower plate 103 from being damaged when a pressure in the buffer chamber 4 of the top chamber 11 has a value between values twice to ten times larger than that of a pressure in the processing chamber 5 of the base chamber 12. As a material of the gas shower plate 103, quartz is used, but any material may be used as long as the material exhibits a relatively small reaction with hydrogen fluoride vapor, such as another ceramic or a plastic resin.

In the present example, as illustrated in FIG. 1, the distance between the gas shower plate 103 and the upper surface of the wafer 14 placed on the stage 15 is set to 1 mm or less. Meanwhile, since an extra space (margin) which prevents a transportation device such as a transportation robot arm from colliding with the stage 15 and the gas shower plate 103 is formed during transportation of the wafer 14, when a mechanism for moving the gas shower plate 103 or the stage 15 is connected thereto to transport the wafer 14, it may also be possible that the gas shower plate 103 moves upward or the stage 15 moves downward to ensure the margin mentioned above. In either case, after the wafer 14 is transported, the distance between the gas shower plate 103 and the stage 15 is reduced again and, in a state where the wafer 14 is placed on the stage 15, the distance between the upper surface of the wafer 14 and the lower surface of the gas shower plate 103 is set to 1 mm or less to fix the respective positions of the wafer 14 and the gas shower plate 103.

Note that each of the operating units of the etching processing apparatus 200 in the present example, such as the stage 15 descried above or the gas shower plate 103, the chiller 17, the mass flow unit 21, the butterfly valve 31, the mechanical booster pump 32, and the gas reservoir units 33 and 34 is communicatively connected to a control unit 35. A signal output from each of the units to represent a state during an operation thereof and an instruction signal output from the control unit 35 in response to the signal representing the state to notify the unit of an operation to be performed thereby are transmitted to each other. The control unit 35 includes an interface unit including a connector for transmitting/receiving each of the signals mentioned above and a converter for converting the signal to another predetermined signal, an arithmetic unit including an arithmetic element such as a micro processor made of a semiconductor, and a storage device unit such as a semiconductor memory, a CD-ROM, a DVD-ROM drive, or a hard disk, and these units are configured to be connected to each other to be capable of signal communication.

The control unit 35 receives a sensing signal from a sensor disposed in optionally selected one of the individual units described above to show a state of the operation thereof, and the arithmetic element reads software stored in the storage device to detect the state of the operation from the sensing signal based on an algorithm thereof. The control unit 35 further calculates, based on a result of a comparison made between the detected result and an intended value, an instruction signal representing an operation which achieves the intended value based on the algorithm of the software in the storage device, and the instruction signal is transmitted from the interface unit of the control unit 35 to the optionally selected one unit. The unit having received the instruction signal adjusts the state of the operation thereof based on the signal to bring the operation state closer to the intended value to be achieved. The same applies also to the other examples described below unless particularly described otherwise.

A description will be given of a flow of the etching processing in the present example. In a vacuum transportation chamber which is an evacuated inner space of a vacuum transportation container connected to a side wall surface of the base chamber 12 and not shown, the wafer 14 is transported to be carried into the processing chamber 5 of the base chamber 12 through a gate which is a passage disposed to horizontally extend through the side wall of the base chamber 12. Then, the wafer 14 is transferred to the stage 15 and placed on the upper surface of the stage 15 in contact relation. To an electrode for electrostatic adsorption in the dielectric film forming the upper surface and not shown, DC power is supplied, and the wafer 14 is electrostatically adsorbed onto the stage 15 and held thereon. To the gap between the back surface of the wafer 14 and the upper surface of the stage 15, a gas having thermal conductivity such as He is supplied and, as a result of heat transfer to the stage 15 cooled to a predetermined value in a range of −20° C. to −50° C., a temperature of the wafer 14 is set to a value in a range equivalent to that of the stage 15 and appropriate for the processing.

For the holding of the wafer 14 described above, either of means using electrostatic adsorption and mechanical adsorption may also used appropriately. In this state, the temperature of the stage 15 is reduced to −35° C. by the refrigerant having the temperature adjusted by the chiller 17. At this time, the processing gas is not supplied into the processing chamber 5 until the control unit 35 detects that the temperature of the wafer 14 has reached a predetermined temperature (−35° C. in the present example) appropriate for the processing based on an output from the temperature sensor disposed in the stage 15 and not shown.

When the control unit 35 recognizes that the temperature of the stage 15 has been reduced to the predetermined temperature by the chiller 17, based on the instruction signal from the control unit 35, the gas in the gas line 2 from the reservoir unit 33 or 34 is introduced as the processing gas containing hydrogen fluoride and alcohol into the buffer chamber 4 in the top chamber 11 through the pipes in the gas line 2. For example, in the present example, hydrogen fluoride, methanol, and an argon gas are introduced respectively at 400 sccm, 200 sccm, and 100 sccm into the buffer chamber 4. In a state where these gases are continuously supplied from the gas line 2 into the buffer chamber 4, the butterfly valve 31 operates in response to the instruction signal from the control unit 35 to adjust the flow rate or speed of the exhaust gas, while the mechanical booster pump 32 is being driven, such that the pressure in the processing chamber 5 has a value in a tolerable range determined in advance and including 300 Pa. Note that, to the top chamber 11 and the base chamber 12, a pressure sensor for sensing the pressure in the buffer chamber 4 or the processing chamber 5 is attached to be communicative with the control unit 35, though not shown.

The processing gas introduced into the buffer chamber 4 passes through the through holes 104 in the gas shower plate 103 to be supplied from the openings of the lower end portions of the through holes 104 into a space (gap 105 illustrated in FIG. 1) between the surface of the aluminum oxide film on the upper surface of the wafer 14 and the lower surface of the gas shower plate 103 in the processing chamber 5. Since the inventors have found that there is linear correlation between a time period during which the processing gas is supplied and an amount of etching of aluminum oxide, the control unit 35 adjusts, based on the correlation described above, an operation of the mass flow unit 21 or the valve on the pipes of the gas line 2 to cause the processing gas to be supplied into the processing chamber 5 only for a predetermined time period. In response to the instruction signal from the control unit 35, the supply of the processing gas is stopped, and the processing of the aluminum oxide film on the wafer 4 is stopped.

Then, the operation of the exhaust unit 3 is continued, and a high-vacuum exhaust step of further reducing the pressure in the buffer chamber 4 and the processing chamber 5 to a degree of vacuum sufficiently higher than that during the step of performing the etching processing described above is performed. By this step, the processing gas and a compound or product generated during the previous processing in the processing chamber 5 are sufficiently exhausted. Then, the holding of the wafer 14 by adsorption is removed, and the wafer 14 is removed from over the stage 15, transferred to the transportation device such as the robot arm having entered the processing chamber 5 from the vacuum transportation chamber, and carried to the outside of the processing chamber 5. Then, depending on a result of determination of whether or not there is the unprocessed wafer to be subsequently processed, the control unit 35 determines whether the processing of the wafer 14 by the etching processing apparatus 200 is to be continued or stopped.

Note that it may also be possible to perform cycle etching in which the step of etching the aluminum oxide film described above, which is performed by introducing the processing gas into the processing chamber 5 only for the predetermined period in a state where the wafer 14 described above is held apart from the gas shower plate 103 with the gap corresponding to a predetermined distance being provided therebetween, and the high-vacuum exhaust step for the gas and particles subsequent to the step are assumed to be a continuous wafer processing step (cycle) which is repeated a plurality of times until an amount of etching such as an intended depth is obtained.

Second Example

Figure 3:
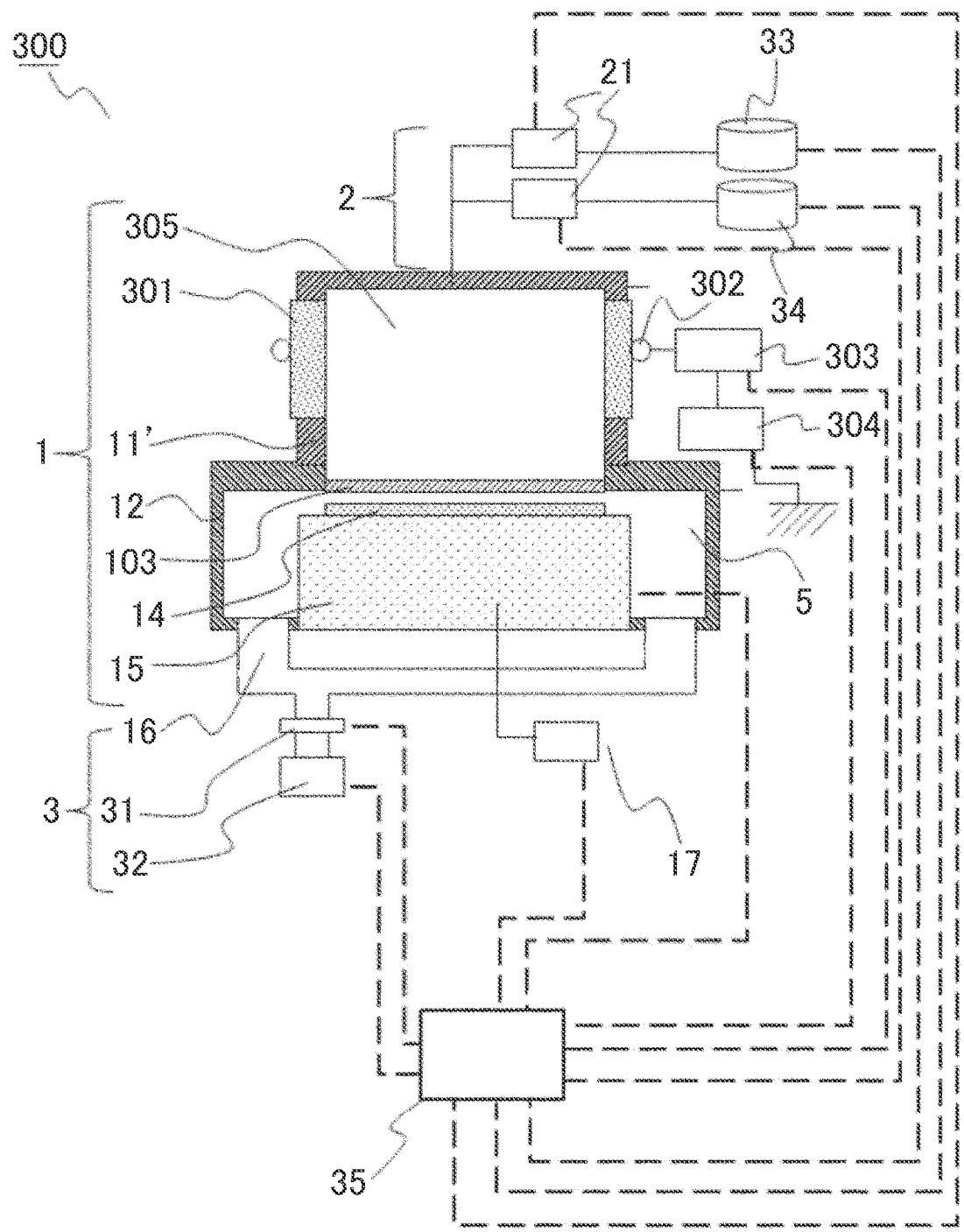
FIG. 3 is a vertical cross-sectional view schematically illustrating an outline of a configuration of an etching processing apparatus according to another example of the present invention.

Next, using FIG. 3, a description will be given of an outline of another example of the present invention. FIG. 3 is a vertical cross-sectional view schematically illustrating an outline of a configuration of an etching processing apparatus according to the other example of the present invention. An etching processing apparatus 300 in a second example has the configuration that uses a plasma to accelerate etching of an aluminum oxide film and removal of residues of a surface thereof.

In the present example, a description of components denoted by the same reference numerals as shown in FIG. 2 is omitted unless necessary such as when the component is different.

A difference between the etching processing apparatus 300 in the present example and the etching processing apparatus 200 in the first example lies in the configuration in which, on the center portion of the ring-shaped lid portion forming the upper part of the base chamber 12, a top chamber 11' having a cylindrical shape having a vertical height larger than that of the top chamber 11 in the first example is placed. In addition, in the top chamber 11', as a side wall having a cylindrical shape, a dielectric cylinder 301 made of quartz and having a cylindrical inner peripheral side wall shape having the same diameter as those of upper and lower cylindrical members made of metal is provided between the upper and lower cylindrical members. As a material of the dielectric cylinder 301, not only quartz, but also a ceramic material such as aluminum oxide, silicon carbide, or aluminum nitride can be used.

Above and below upper and lower ring-shaped end portions of the dielectric cylinder 301, the ring-shaped members made of metal and similarly forming the side wall portion of the top chamber 11' are disposed. Between the dielectric cylinder 301 and these ring-shaped members made of metal, vacuum seals such as O-rings are vertically held to be deformed and hermetically define an inner space from the outside of the top chamber 11' surrounded by a barometric atmosphere.

Around the cylindrical outer peripheral side wall of the dielectric cylindrical member 301, a discharge coil antenna 302 wound to surround the outer peripheral side wall is disposed to be spaced apart from the outer peripheral side wall. To the coil antenna 302, an RF power source 304 that supplies RF power is electrically connected via a matching unit 303. In FIG. 3, the antenna 102 is wound only once, but may also be wound twice or three or more times or may also be wound in a plurality of stages in the vertical direction.

The top chamber 11' in the present example has a cylindrical inner space, and a cylindrical side wall of the top chamber 11' including the dielectric cylindrical member 301 circumferentially surrounds the space. In addition, the RF power supplied to the coil antenna 302 wound around the outer peripheral side wall of the dielectric cylindrical member 301 outside thereof forms an induction field in the cylindrical inner space. Atoms or molecules of the gases supplied from the gas line 2 connected to the circular-disk-shaped lid member of the top chamber 11' are excited by an induction current generated by the induction field to undergo dissociation or ionization to form the plasma. Thus, the cylindrical inner space of the top chamber 11' in the present example serves as a discharge chamber 305 in which the plasma is to be formed.

A description will be given of a flow of etching processing of the wafer 14 in the etching processing apparatus 300 in the second example. In the present example, the processing gas supplied into the discharge chamber 305 which is the inner space of the top chamber 11 is excited by the induction field generated by the RF power supplied to the coil antenna 302 to generate the plasma, and particles of the plasma are used to accelerate the etching of the aluminum oxide film or remove the residues of the surface thereof.

After transported to the processing chamber 4 in the base chamber 12 in the same manner as in the first example, the wafer 14 is held by adsorption on the stage 15, and the control unit 35 detects that the temperature of the stage 15 or the wafer 14 is adjusted to a value in a tolerable range appropriate for the processing, which includes a predetermined temperature, e.g., −30° C. In the present example also, the introduction of the processing gas into the discharge chamber 305 or the formation of the plasma is not performed until it is detected that the temperature mentioned above is set to a value in the range appropriate for the processing.

In the present example, when it is determined that a state of oxidation of the surface of the aluminum oxide film is insufficient, in a state where the wafer 14 is adsorbed onto the stage 15 and held thereon, an oxygen gas is supplied from the gas line 2 into the inner discharge chamber 305 of the top chamber 11' to form the plasma using the oxygen in the discharge chamber 305. It may also be possible to supply particles formed in the plasma to the aluminum oxide film on the surface of the wafer 14 in the processing chamber 5 through the through holes 104 in the gas shower plate 103, to perform oxidization of the surface using the plasma particles. As a result of performing the step of oxidizing the surface, an uneven state of oxidation of the top surface of the aluminum oxide film is reduced to smooth the top surface, and etching entailing reduced surface roughness (roughness) can be performed.

As an example of conditions for formation of the plasma using the oxygen, the oxygen gas is introduced at 100 sccm into the discharge chamber 305 to adjust the inner pressure to 50 Pa. In this state, the RF power is supplied from the RF power source 104 to the coil antenna 302 to excite the oxygen gas, cause dissociation or ionization thereof, and form the plasma. In the present example, the particles of the oxygen plasma pass through the through holes 104 of the gas shower plate 103 to be supplied to the aluminum oxide film on the upper surface of the wafer 14 from the openings of the lower ends thereof. Some of the particles enter the gap between the gas shower plate 103 and the aluminum oxide film of the wafer 14 to cause an oxidation reaction over the entire surface of the aluminum oxide film. Such introduction of the particles in the plasma is performed for 15 seconds.

After the step of applying the oxygen plasma, the discharge chamber 305 and the processing chamber 5 are internally evacuated to a high degree of vacuum to exhaust and replace the gas. Then, through the gas line 2, a hydrogen fluoride gas is introduced into the discharge chamber 305, and the same step of the etching processing of the aluminum oxide film as performed in the first example is performed. In addition, in the same manner as in the first example, the control unit 35 supplies the processing gas only for the predetermined time period and then transmits the instruction signal to the mass flow unit 21 or the opening/closing valve on the gas line 2 to stop the supply of the gas and stop the etching step for the aluminum oxide film. Further, the exhaust unit 3 continues to exhaust the gas and, after the discharge chamber 305 or the processing chamber 5 is evacuated to reach a high degree of vacuum and the gas and the particles therein are sufficiently exhausted, the adsorption of the wafer 14 onto the stage 15 is removed, and the wafer 14 is transported from the stage 15 into the vacuum transportation chamber outside the processing chamber 5 through the open gate in the side wall of the base chamber 12.

In the example of the processing of the wafer 14 described above, each of the step of oxidation for the aluminum oxide film by the oxygen plasma and the step of etching the aluminum oxide film using the hydrogen fluoride is performed once. However, it may also be possible to perform cycle etching in which, after the step of the etching processing of the aluminum oxide film is performed and the exhaust is performed to high vacuum, a continuous cycle including the oxidation step of introducing the oxygen gas again into the discharge chamber 305 and forming the oxygen plasma, the subsequent high-vacuum exhaust step, and the step of etching the aluminum oxide film by using the hydrogen fluoride is repeated at least once or more. Alternatively, it may also be possible to perform cycle etching in which, before the step of the etching processing to be performed by supplying the hydrogen fluoride gas, the oxidation step for the aluminum oxide film is performed once, and then a continuous cycle including a plurality of steps including the step of the etching processing and the high-vacuum exhaust step of exhausting, before or after the etching processing step, the processing chamber 5 or the discharge chamber 305 to a high degree of vacuum is repeated at least once or more.

When a supply of fluorine via the hydrogen fluoride (HF) gas is insufficient, after the wafer 14 is placed and held on the stage 15 and before the step of etching using the hydrogen fluoride gas, as one of the series of steps included in the cycle described above, the step of introducing a fluorocarbon gas into the discharge chamber 305 to form a plasma and fluoridize the surface of the aluminum oxide film may also be performed. By the step of fluoridizing the surface, fluorocarbon adheres to the surface of the aluminum oxide film to accelerate etching performed by introducing the hydrogen fluoride gas.

Conditions for forming the plasma using the fluorocarbon gas in the present example are such that an amount of the introduced $CH_4$ gas is 100 sccm and the pressure in the discharge chamber 305 is 50 Pa. In this state, the induction field due to the RF power from the antenna 302 is used to form the plasma, and the particles in the plasma are supplied to the surface of the wafer 14 through the through holes 104 in the gas shower plate 103 for 15 seconds. In addition, it may also be possible to perform cycle etching in which the step of fluoridizing using a fluorocarbon plasma and the step of etching using the hydrogen fluoride (including also the high-vacuum exhaust step between these steps) are repeated in one cycle at least once or more. Alternatively, it may also be possible to perform cycle etching in which, before the etching processing step, the step of fluoriding the aluminum oxide film supplied with the particles in the plasma of the fluorocarbon gas is performed once, and then a plurality of series of steps including the etching processing step and the high-vacuum exhaust step before or after the etching processing step are repeated in one cycle at least once or more.

The fluorocarbon gas used in the present example is not limited to $CF_4$, and may also be a fluorocarbon gas such as $C_4F_8$ or $C_4F_6$ or hydrofluorocarbon such as $CHF_3$ or $CH_2F_2$. It may also be possible to use a gas other than a carbon gas, such as $NF_3$ or $SF_6$. Alternatively, it may also be possible to simultaneously allow fluorocarbon and hydrogen fluoride to flow and ignite the plasma to accelerate an etching reaction.

When there are residues on the surface of aluminum oxide after the step of etching using the hydrogen fluoride gas, after the step of etching and before the step of transporting the wafer 14 from the upper surface of the stage 15, a step or removing the residues using a plasma may also be performed. In the present example, conditions for forming the plasma for removing the residues are set such that a flow rate of each of a nitrogen gas and a hydrogen gas into the discharge chamber 305 is 100 sccm and the pressure in the discharge chamber 305 is 50 Pa. In this state, particles in the plasma formed in the discharge chamber 305 are supplied to the aluminum oxide film through the gas shower plate 103 only for 15 seconds.

It may also be possible to perform cycle etching in which the step of removing the residues is performed as the step included in the cycle described above and, after the step of removal, the high-vacuum exhaust step is performed on the discharge chamber 305 or the processing chamber 5, the step of etching using the hydrogen fluoride gas is then performed again, and these steps are repeated.

Third Example

Figure 4:
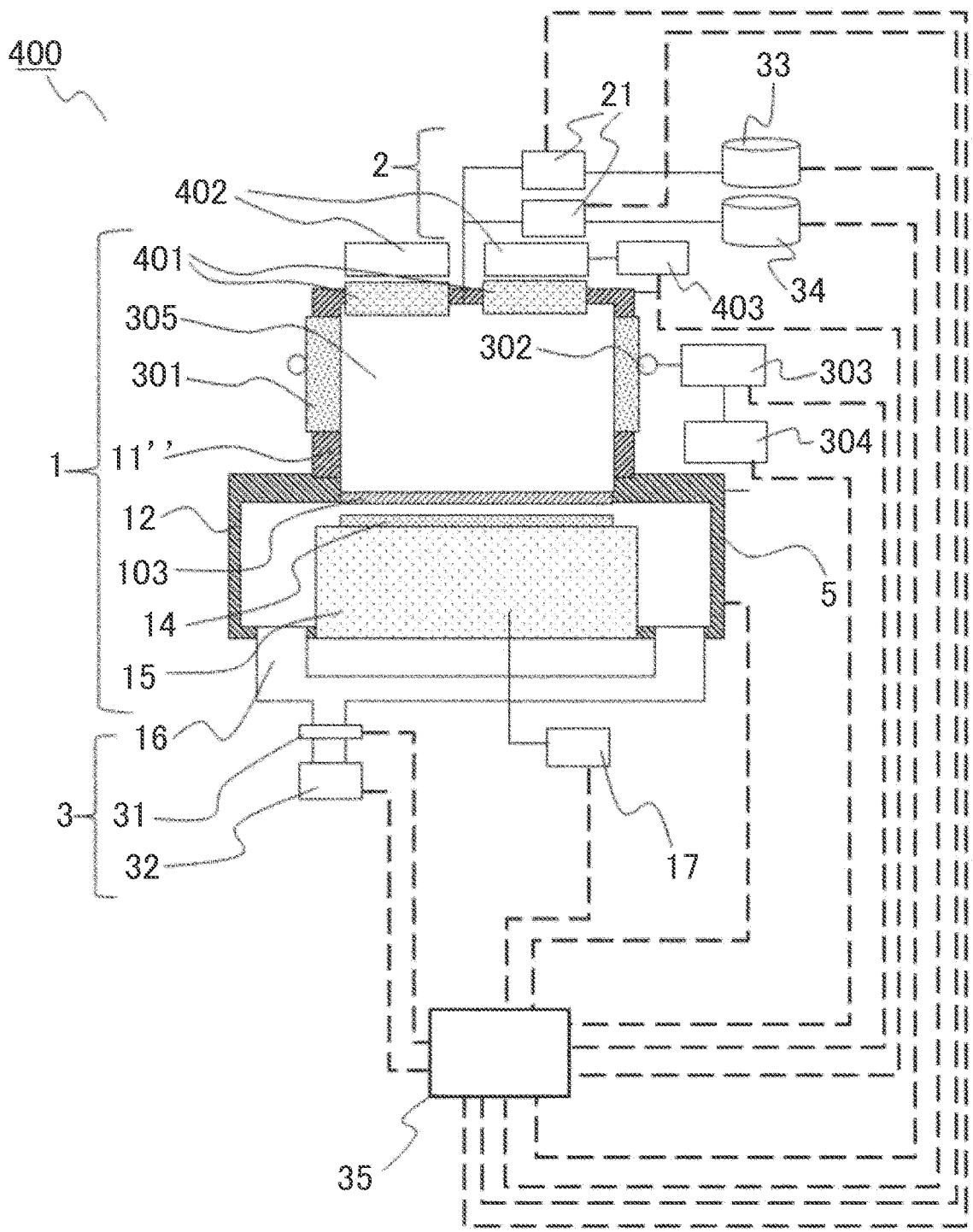
FIG. 4 is a vertical cross-sectional view schematically illustrating an outline of a configuration of an etching processing apparatus according to still another example of the present invention.

Using FIG. 4, a description will be given of still another example of the present invention. FIG. 4 is a vertical cross-sectional view schematically illustrating an outline of a configuration of an etching processing apparatus according to still another example of the present invention. An etching processing apparatus 400 in the present example includes, in addition to the configuration shown in the second example, a configuration that uses radiation of light emitted from a lamp to accelerate the etching of aluminum oxide and the removal of the residues on the surface.

In the present example, a description of components denoted by the same reference numerals as shown in FIG. 2 or 3 is omitted unless necessary.

A difference between the etching processing apparatus 400 in the present example and the etching processing apparatus 300 in the second example lies in that the lid member having the circular disk shape in an upper part of a top chamber 11" includes a dielectric window 401 having translucency of quartz or the like and disposed in a ring configuration around the vertical center axis of the lid member, and a lamp heater unit 402 is similarly disposed in a ring configuration around the center axis externally over the lid member and over the dielectric window 401. The dielectric window 401 is attached to the lid member of the top chamber 11" with a seal such as an O-ring being interposed therebetween, and deformation of the seal provides hermetical separation between an outer space containing a barometric atmosphere and the inside of the discharge chamber 305 in the top chamber 11". As a material forming the dielectric window 401, instead of quartz, a ceramic material such as aluminum oxide, silicon carbide, or aluminum nitride can be used.

Over the dielectric window 401, the lamp heater unit 402 is disposed and, to the lamp heater unit 402, a DC power source 403 is electrically connected to supply power to the lamp heater unit 402. As the lamp heater unit 402 in the present example, a halogen lamp is used, but it may also be possible to use a lamp which emits infrared (Infra-Red, sIR) light and a heating effect of heating the wafer 14.

The top chamber 11" is placed and attached onto the lid member forming the upper part of the base chamber 12 around the opening of the circular through hole disposed in the center portion of the lid member with a seal such as an O-ring being interposed therebetween. A diameter of the discharge chamber 305 which is the cylindrical space disposed in the top chamber 11" is set to the same value as that of the opening of the through hole in the center portion of the lid member of the base chamber 12 described above or to an approximate value that can be regarded as the same as that of the opening of the through hole.

The gas shower plate 103 has a circular disk shape formed of a material having translucency such as quartz and is disposed in the lower end portion of the through hole of the lid member of the base chamber 12 to form the ceiling surface of the processing chamber 5. A diameter of the circular disk shape of the gas shower plate 103 is set to be the same as or larger than that of the wafer 14 to be placed on the stage 15 therebelow to prevent the light emitted from the lamp heater unit 402 located thereabove from being blocked halfway in a path before being applied to the aluminum oxide film on the upper surface of the wafer 14 to result in a reduced amount of the light.

Next, a description will be given of a flow of the etching processing of the aluminum oxide film in the present example. In the present example, in the same manner as in the second example, the processing gas supplied into the discharge chamber 305 which is the inner space of the top chamber 11 is excited by the induction field generated by the RF power supplied to the coil antenna 302 to generate the plasma, and particles of the plasma are used to accelerate the etching of the aluminum oxide film or remove the residues of the surface thereof. In addition, in the present example, using heating of the aluminum oxide film by radiation of the light applied from the lamp heater unit 402 to the wafer 14, the etching of the aluminum oxide film is accelerated or the residues of the surface thereof are removed.

After transported to the processing chamber 4 in the base chamber 12 in the same manner as in the first example, the wafer 14 is held by adsorption on the stage 15, and the control unit 35 detects that the temperature of the stage 15 or the wafer 14 is adjusted to a value in a tolerable range appropriate for the processing, which includes a predetermined temperature, e.g., −30° C. In the present example also, the introduction of the processing gas into the discharge chamber 305 or the formation of the plasma is not performed until it is detected that the temperature mentioned above is set to a value within the range appropriate for the processing.

By an effect of applying the light from the lamp heater unit to the wafer 14 to heat the wafer 14 and increase the temperature thereof, a reaction of the etching of the aluminum oxide film is accelerated compared to that in a step of etching thereof using only a gas. In a state where the wafer 14 is placed and held on the stage 15 and a gas containing hydrogen fluoride is supplied to the upper surface of the aluminum oxide film through the discharge chamber 305 and the through holes 104 in the gas shower plate 103, by the application of the light from the lamp heater unit 402, the temperature of each of the wafer 14 and the aluminum oxide film is increased from the temperature of −25° C. or less described above to a value of 200° C. to 300° C. Alternatively, it may also be possible that, after the light from the lamp heater unit 402 is applied to the wafer 14 to increase the temperature thereof to a value of 200° C. to 300° C., the gas containing the hydrogen fluoride is supplied from the gas line 2 to the surface of the aluminum oxide film through the discharge chamber 305 and the gas shower plate 103.

There is also a case where, to or on each of a side wall of the gas shower plate 103, a surface thereof including inner portions of the through holes 104, and the surface of the wafer 14, a product generated in the discharge chamber 305 or the processing chamber 5 adheres or is deposited. To remove such an adhering or deposited material, after the step of etching performed by supplying the processing gas to the top surface of the silicon oxide film only for a predetermined time period and before the step of performing processing on the surface of the wafer 14 subsequently to the next high-vacuum exhaust step or the like is started, a step of lighting (turning ON) the lamp heater unit 402 to apply the light to the wafer 14 and heat the wafer 14 in vacuum or in a state where the gas has been introduced into the discharge chamber 5 and into the upper surface of the aluminum oxide film, and thereby removing the deposited or adhering material can also be performed. In the present example also, it may also be possible to perform the step of cycle etching in which such a desorption or cleaning step for the surface of the wafer 14 or the inner portion of the chamber using heating is assumed to be included in one cycle as the plurality of series of steps shown in the first and second examples and the cycle is repeated at least once or more or perform the desorption or cleaning step before or after the cycle in each of the first and second examples is performed.

As the desorption or cleaning step using heating described above in the present example, a step using radiation of the light applied from the lamp heater unit 402 having a halogen lamp illustrated in FIG. 4 to the surface of the wafer 14 is used. A means for heating the wafer 14 is not limited to that using the infrared light (IR light) included in the halogen lamp in the present example. For example, it may also be possible to implement a method of heating the stage 15 using electric power supplied to a linear or film-shaped heater disposed in the stage 15 to heat the wafer 14 through heat transfer or perform heating by transporting the wafer 14 from the etching chamber 100 to another device.

Note that, in each of the examples described above, the etching processing of the aluminum oxide film which is performed by supplying the gas containing the hydrogen fluoride is performed, while the gap between the gas shower plate 103 having the through holes 104 through which the gas is supplied and the upper surface of the aluminum oxide film or the wafer 14 is maintained at 1 mm or less and the temperature of the aluminum oxide film or the wafer 14 is maintained at a value in a range of −50 to −20° C. Meanwhile, in each of the high-vacuum exhaust step, the oxidation step, the fluoridation step, the residue removal step, or the desorption or cleaning step, the gap or temperature of the wafer 14 (or the stage 15 supporting the wafer 14) described above is maintained at a size or magnitude that allows these steps to be effectively or efficiently performed. For example, as described above, the stage 15 or the gas shower plate 103 in the present example is configured to be movable in the vertical direction. It may also be possible that, not only during an operation when the wafer 14 is placed on the stage 15 or removed therefrom, but also in the high-vacuum exhaust step and the oxidation or fluoridation step using the particles in the plasma formed in the discharge chamber 305, the stage 15 or the gas shower plate 103 moves in response to the instruction signal from the control unit 35 to adjust the size of the gap therebetween to an appropriate value.

Alternatively, it may also be possible that, in the desorption or cleaning step using heating performed by applying the light from the lamp heater unit 402 to the surface of the wafer 14 described above, the stage 15 is moved in the vertical direction to adjust a distance between the lamp heater unit 402 and the wafer 14 to a value appropriate for the step. In the example in FIG. 4, the lamp heater unit 402 is disposed above the top chamber 11' serving as the lid member over the discharge chamber 305. However, it may also be possible to dispose the lamp heater unit 402 outside and around the top chamber 11" or the dielectric cylindrical member 301 and dispose a window member formed of a member having translucency such as quartz instead of the lid of the base chamber 12 or a top plate member, while hermetically sealing the inside of the base chamber 12 from the outside thereof. At this time, by providing a configuration in which the stage 15 is disposed at a height position in the vertical direction at a sufficient distance from the window member, non-uniformity of an amount of the light emitted from the lamp heater unit 402 disposed in a ring configuration around the gas shower plate 103 and applied to the wafer 14 or a strength of the light is reduced.

LIST OF REFERENCE SIGNS

1 Vacuum chamber
2 Gas line
3 Exhaust unit
4 Processing chamber
5 Buffer chamber
11, 11', 11" Top chamber
12 Base chamber
14 Wafer
15 Stage
16 Exhaust port
17 Chiller
21 Mass flow unit
31 Butterfly valve
32 Mechanical booster pump
200 Etching processing device
300 Etching processing device
301 Dielectric cylindrical member
302 Coil antenna
303 Matching unit
304 RF power source
305 Discharge chamber
400 Etching processing device
401 Dielectric window
402 Lamp heater unit
403 DC power source

The invention claimed is:

1. An etching processing method comprising the step of: placing, in a processing chamber, a wafer having an aluminum oxide film disposed on an upper surface thereof, maintaining the wafer at a temperature of −20° C. or less, and supplying vapor of hydrogen fluoride from a plurality of through holes in a plate member disposed above the upper surface of the wafer with a gap being provided therebetween only for a period to etch the aluminum oxide film.

2. The etching processing method according to claim 1, wherein vapor of a mixture of the hydrogen fluoride and alcohol is supplied to the gap.

3. The etching processing method according to claim 2, wherein a plurality of steps including the step of introducing the vapor of the hydrogen fluoride to perform etching processing of the aluminum oxide film and a step of exhausting an inner space of a vacuum container until a pressure lower than that during the step of performing the etching processing is reached are assumed to be in a continuous cycle which is repeated a plurality of times.

4. The etching processing method according to claim 2, further comprising the step of:
before or after the step of introducing the vapor of the hydrogen fluoride to perform etching processing of the aluminum oxide film, supplying particles formed in a plasma formed using a fluorocarbon gas to a surface of the aluminum oxide film.

5. The etching processing method according to claim 2, further comprising the step of:
before or after the step of introducing the vapor of the hydrogen fluoride to perform etching processing of the aluminum oxide film, supplying particles formed in a plasma formed using a nitrogen gas or a hydrogen gas to the aluminum oxide film.

6. The etching processing method according to claim 1, wherein the aluminum oxide film is etched while a temperature of the wafer is maintained at a value in a range of −50° C. to −20° C.

7. The etching processing method according to claim 6, wherein the aluminum oxide film is etched while a temperature of the wafer is maintained at −35° C.

8. The etching processing method according to claim 1, wherein a size of the gap is 3 mm or less.

9. The etching processing method according to claim 8, wherein a size of the gap is 1 mm.

10. The etching processing method according to claim 1, wherein a distance between adjacent ones of the plurality of through holes is set to a value in a range of 1 mm to 3 mm.

11. The etching processing method according to claim 10, wherein a distance between adjacent ones of the plurality of through holes is 2 mm.

12. The etching processing method according to claim 1, wherein a diameter of each of the plurality of through holes is set to a value in a range of 1 mm to 3 mm.

13. The etching processing method according to claim 12, wherein a diameter of each of the plurality of through holes is 2 mm.

14. The etching processing method according to claim 1, wherein a plurality of steps including the step of introducing the vapor of the hydrogen fluoride to perform etching processing of the aluminum oxide film and a step of exhausting an inner space of a vacuum container until a pressure lower than that during the step of performing the etching processing is reached are assumed to be in a continuous cycle which is repeated a plurality of times.

15. The etching processing method according to claim 1, further comprising the step of:
before or after the step of introducing the vapor of the hydrogen fluoride to perform etching processing of the aluminum oxide film, supplying particles formed in a plasma formed using a fluorocarbon gas to a surface of the aluminum oxide film.

16. The etching processing method according to claim 1, further comprising the step of:
before or after the step of introducing the vapor of the hydrogen fluoride to perform etching processing of the aluminum oxide film, supplying particles formed in a plasma formed using a nitrogen gas or a hydrogen gas to the aluminum oxide film.

17. The etching processing method according to claim 1, wherein a plurality of steps including the step of introducing the vapor of the hydrogen fluoride to perform etching processing of the aluminum oxide film and a step of heating the wafer to desorb a product adhering onto the upper aluminum oxide film are assumed to be in a continuous cycle, and the cycle is repeated a plurality of times.

18. An etching processing apparatus comprising:
a vacuum container;
a stage disposed in a space of the vacuum container and having an upper surface on which a wafer to be processed having an aluminum oxide film disposed in advance on a surface thereof is to be placed;
a plate member disposed above the aluminum oxide film of the wafer being placed on the stage to face the aluminum oxide film with a predetermined gap being provided therebetween, the plate member including a plurality of through holes through which vapor of a processing gas containing hydrogen fluoride is to be introduced into a space located above the aluminum oxide film and including an interior of the gap; and
a temperature adjustment mechanism that adjusts a temperature of the stage or the wafer placed thereon to −20° C. or less.

19. The etching processing apparatus according to claim 18, comprising:
the plate member having the plurality of through holes through which vapor of the hydrogen fluoride and alcohol is to be introduced into the gap.

20. The etching processing apparatus according to claim 18, comprising:
the temperature adjustment mechanism that adjusts the temperature of the stage or the wafer placed thereon to a value in a range of −50° C. to −20° C.

21. The etching processing apparatus according to claim 20, wherein the temperature adjustment mechanism adjusts the temperature of the stage or the wafer placed thereon to −35° C.

22. The etching processing apparatus according to claim 18, wherein a size of the gap is 3 mm or less.

23. The etching processing apparatus according to claim 22, wherein a size of the gap is 1 mm or less.

24. The etching processing apparatus according to claim 18, wherein a distance between the plurality of through holes in the plate member ranges from 1 mm to 3 mm.

25. The etching processing apparatus according to claim 24, wherein a distance between the plurality of through holes in the plate member is 2 mm.

26. The etching processing apparatus according to claim 18, wherein a diameter of each of the through holes ranges from 1 mm to 3 mm.

27. The etching processing apparatus according to claim 26, wherein a diameter of each of the through holes is 2 mm.

28. The etching processing apparatus according to claim 18, further comprising:
a lamp or heater for heating the wafer placed on the stage, the lamp being disposed above the stage to apply light to the wafer, the heater being disposed in the stage.

* * * * *